United States Patent [19]

Peiffer et al.

[11] Patent Number: 5,760,596
[45] Date of Patent: Jun. 2, 1998

[54] TESTING SERIES PASSIVE COMPONENTS WITHOUT CONTACTING THE DRIVEN NODE

[75] Inventors: Ronald J. Peiffer, Loveland; Kenneth P. Parker, Fort Collins, both of Colo.

[73] Assignee: Hewlett-Packard Company, Palo Alto, Calif.

[21] Appl. No.: 810,202

[22] Filed: Mar. 3, 1997

Related U.S. Application Data

[63] Continuation of Ser. No. 481,023, Jun. 7, 1995, abandoned.
[51] Int. Cl.[6] .................................................. G01R 27/08
[52] U.S. Cl. ........................... 324/715; 324/754; 324/755; 324/603
[58] Field of Search ........................................ 324/430, 715, 324/754, 756, 771, 755

[56] References Cited

U.S. PATENT DOCUMENTS

| | | | |
|---|---|---|---|
| 3,873,911 | 3/1975 | Champlin | 324/430 |
| 4,651,088 | 3/1987 | Sawada | 324/715 |
| 5,467,024 | 11/1995 | Swapp | 324/771 |

FOREIGN PATENT DOCUMENTS

| | | | |
|---|---|---|---|
| 2269019 | 1/1994 | United Kingdom | 324/430 |

*Primary Examiner*—Ernest F. Karlsen
*Assistant Examiner*—Jose M. Solis
*Attorney, Agent, or Firm*—Augustus W. Winfield

[57] ABSTRACT

A method of testing series passive components in electronic assemblies. Only one test pin per passive component is required, thereby reducing the cost and complexity of test fixtures and the electronic assemblies. A passive component is connected between the output of a driving circuit and (optionally) an input of a receiving circuit. The output of the driving circuit is placed in a low impedance state. The receiving end of the passive component is stimulated and the response is measured. For reactive components, the stimulus and response are AC. For resistors, multiple DC measurements may be made. A optional DC bias may be provided to limit DC current and to further reduce the small signal output impedance of the driving circuit.

7 Claims, 5 Drawing Sheets

TESTING SERIES PASSIVE COMPONENTS WITHOUT CONTACTING THE DRIVEN NODE

CROSS REFERENCE TO RELATED APPLICATION

This is a continuation of application Ser. No. 08/481,023 filed on Jun. 7, 1995, now abandoned.

FIELD OF INVENTION

This invention relates generally to testing of electronic assemblies and more specifically to testing of passive components mounted onto printed circuit boards.

BACKGROUND OF THE INVENTION

A common approach for testing electronic printed circuit boards during manufacturing requires probing intermediate nodes on a board with spring loaded pins in a test fixture called a "bed-of-nails" fixture. Electronic printed circuit boards typically contain both integrated circuits and discrete components. Measurement of a single series passive component (to verify that the correct component is physically present and is properly soldered) typically requires two dedicated test pins to electrically access both ends of the passive component. In addition, the tester must have resources available at each test pin (for example, voltage sources, current sources, voltmeters, ammeters, etc.). For general background on testing mounted passive components and the tester resources required, see D. T. Crook, "Analog In-Circuit Component Measurements: Problems and Solutions," *Hewlett-Packard Journal*, Vol. 30, no. 3, Mar. 1979.

As digital circuits become faster, it is becoming more common for circuit designers to use a resistor or other passive component between an output of one digital device and an input of a second digital device. These series components minimize ringing at gate inputs. FIG. 1 illustrates a series passive component and a typical prior-art circuit used by a bed-of-nails board tester to test the series component. In FIG. 1, a printed circuit board 100 has a first integrated circuit 102. Integrated circuit 102 has an output driving a series passive component 104 that in turn is connected to an input of a second integrated circuit 106. Each end of component 104 is electrically contacted by a test pin or "nail" (108, 110). The nails (108, 110) are held in a test fixture 114 and electrically connected to circuitry in a tester 116. The test arrangement of FIG. 1 is typically performed with the power to the integrated circuits 102 and 106 turned off. One end of component 104 is connected via nail 110 to a voltage source 118. Voltage source 118 is typically about 0.1 V or a similar voltage that is below the threshold voltage of semiconductor junctions so that no appreciable current flows through the output of driving circuit 102. The other end of the passive component 104 is connected via nail 108 to an operational amplifier 120. The output of the operational amplifier is measured by a detector 124.

As circuit boards become more complex, an increasing number of parts and nodes typically requires a corresponding increasing number of test pins, making test fixtures more complex, more difficult to wire, and more expensive. In addition, testers become more complex and expensive because of the additional tester resources required. As series termination resistors or other series components become more common there is need for testing these components without requiring two test pins for each resistor.

Reducing the number of test pins required may also reduce the complexity of the printed circuit boards. For circuit boards with surface mount integrated circuits and surface mount termination components, special nodes or vias may be needed to enable access by test fixture nails. Therefore, reducing the number of nails required for component testing may also reduce circuit board complexity by eliminating special test pads or vias.

Complex digital integrated circuits often include additional circuitry to facilitate testing. One example is circuitry to capture the state of input/output signals, called boundary scan testing. A commonly used standard for such circuitry is IEEE Std. 1149.1-1990, IEEE *Standard Test Access Port and Boundary-Scan Architecture*, available from The Institute of Electrical and Electronic Engineers, Inc., 345 East 47th Street, New York, N.Y. 10017-2394. IEEE Std. 1149.1 defines a standard serial interface through which test instructions and test data are communicated. The technique involves the inclusion of a shift-register stage inside the digital circuit, adjacent to each component pin of interest on the digital circuit, so that signals at component boundaries can be controlled and observed. The special shift-registers and test instructions can be used in isolated component testing and in testing individual components assembled into larger systems. In the invention, digital outputs may need to be placed into a known state. If known output states are required, boundary scan test circuitry may be used for establishing the required output states.

In FIG. 1, digital test circuitry 126 in tester 116 provides various digital stimulus signals and measures various digital responses as part of testing circuits 102 and 106. Typically there are many nails 112 for many digital nodes. Where boundary scan circuitry is not available, the invention uses conventional well known digital in-circuit test techniques to place digital circuits into known states. For example, see Robert E. Balliew, "Automatic Test Program Generation for Digital Board Testing," *Hewlett-Packard Journal*, Vol 35, no. 10, October 1984. Digital test circuitry 126 may be a combination of conventional and boundary scan test circuitry.

SUMMARY OF THE INVENTION

Series passive components, for example termination resistors, are connected between outputs of driving gates and typically (but not necessarily) to inputs of receiving gates. The invention tests the series passive components with only one test probe per passive component, thereby reducing the cost and complexity of test fixtures, testers, and the printed circuit boards being tested. DC power is provided to the digital integrated circuits in the assembly. The output of each driving gate is placed into a low impedance state (either high or low). In some embodiments, each driving gate is placed into a particular known state. The side of the passive component that is opposite the driven side is then stimulated. In general, the stimulus may be either voltage or current. In some embodiments for series resistors, multiple DC measurements are made. In alternative embodiments for either resistors or reactive components, a single AC measurement is made. Since the output impedance of the driving gate is low and the input impedance of the receiving gate (if present) is high, the impedance of the series passive component can be approximated. For AC measurements, an optional DC bias may also be provided to further reduce the output impedance of the driving gate.

DETAILED DESCRIPTION OF THE PREFERRED EMBODIMENT OF THE INVENTION

Figure 1:
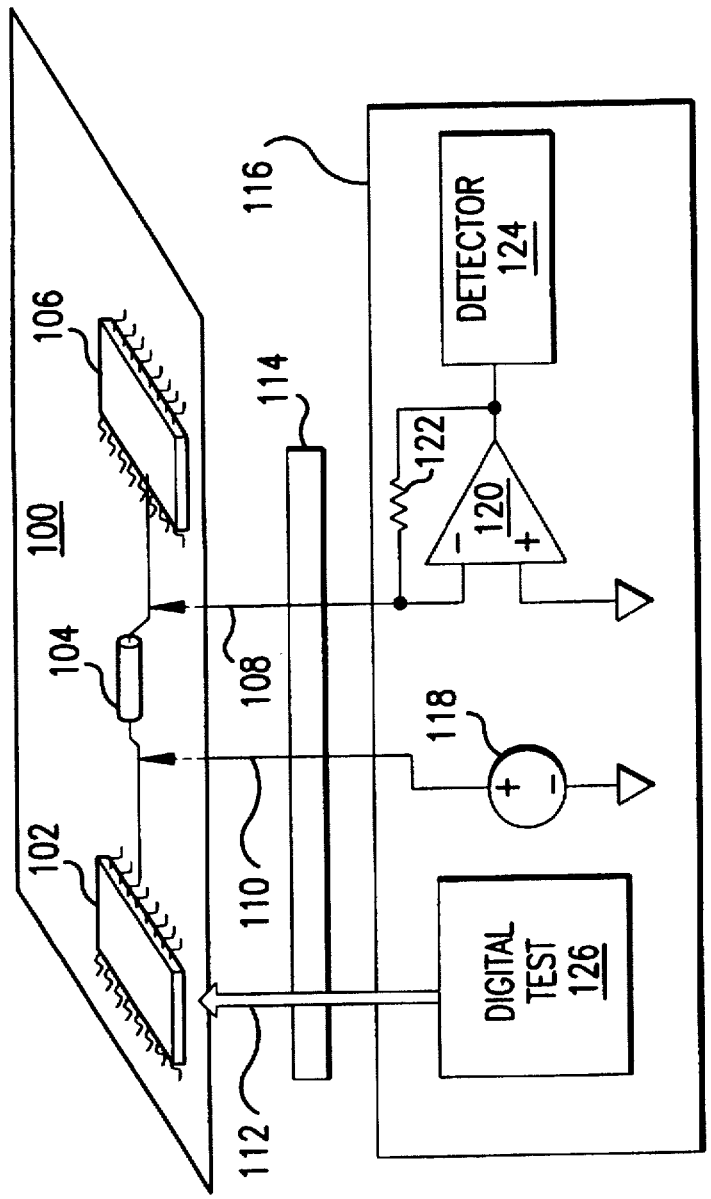
FIG. 1 is a block diagram schematic of a series passive component and prior-art bed-of-nails test circuitry.
Figure 2:
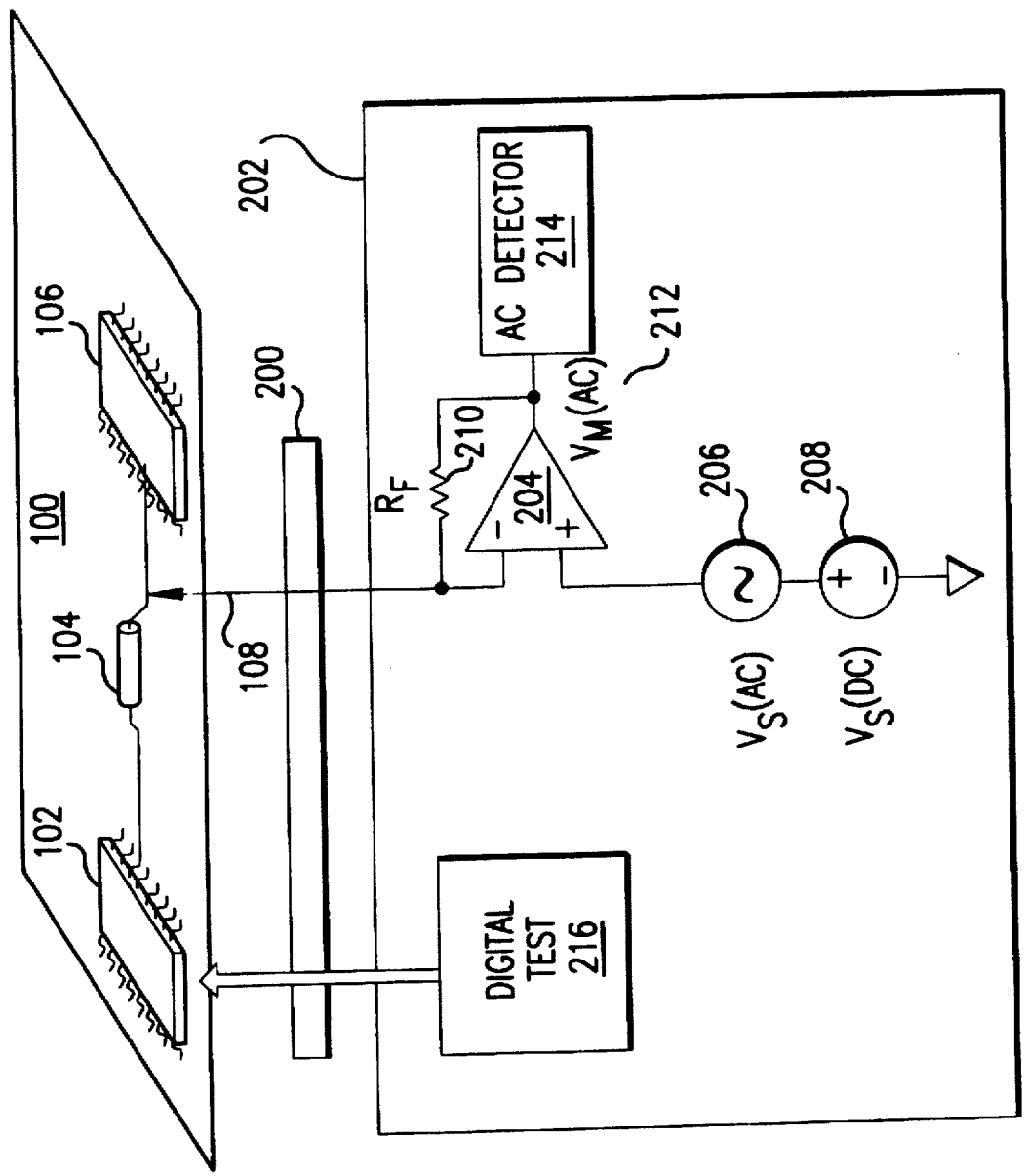
FIG. 2 is a block diagram schematic of a series passive component and bed-of-nails test circuitry in accordance with the invention.

FIG. 2 illustrates one example embodiment of the invention. Circuit board 100, integrated circuits 102 and 106, passive component 104, and test pin or "nail" 108 are all as illustrated in FIG. 1. In FIG. 2, however, test fixture 200 is simpler than test fixture 114 in FIG. 1 because only one nail 108 is used exclusively for testing the series passive component 104. As discussed in more detail below, circuit 106 may or may not be present and circuit 106 is not necessary.

A key element of the invention is that the output of the driving circuit 102 is at a low impedance. Note that when a digital integrated circuit is powered off, input and output impedances are essentially the same. Typically, with power off, digital outputs are effectively diodes (semiconductor junctions), with a high impedance for voltages below the diode breakdown voltage and low impedance for voltages above the diode breakdown voltage. Powering the digital circuit on enables an active low impedance at output terminals. The small signal AC impedance is typically less than the large signal impedance. The AC impedance may be made even smaller if a DC bias current is present. In the embodiment illustrated in FIG. 2, digital circuits 102 and 106 have power applied.

Some digital devices may inherently have a low output impedance at power on. Other digital devices may have to be actively set to a low impedance state. For example, some digital line drivers have three states: low, high and off. A tri-state output has a low impedance at the low and high states but has a high impedance at the off state. In some embodiments of the invention, for example the embodiment of FIG. 2, it is necessary for the tester to know the output state of the digital driving circuit 102. In other embodiments, for example the embodiment of FIG. 3, only a low output impedance is required and it is not necessary to know the particular output state.

If a known output state is required, digital test circuitry 216 is used to place the output of the driving circuit 102 in a known low impedance state, typically a low output. Preferably, the output is placed in a low impedance state by boundary scan EXTEST functionality as described by IEEE standard 1149.1. Where boundary scan capable devices are available, all targeted drivers can be set to the required low impedance states simultaneously. Boundary scan functionality is preferable also because boundary scan is a static technology so that even integrated circuits with internal dynamic logic can be set to the required low impedance output state. If boundary scan is not available, conventional well known digital in-circuit techniques may be used.

In FIG. 2, a source voltage $V_S$ has both an AC component and a DC component, depicted as separate voltage sources $V_S$ (AC) 206 and $V_S$ (DC) 208 respectively. Assuming that the operational amplifier 204 is operating in a linear region, the voltage across the inputs of amplifier 204 is substantially zero so that the voltage at nail 108 is substantially the same as the source voltage at the positive input of amplifier 204. $V_S$ (DC) 208 is adjusted to ensure that a limited bias current flows through the output of the driving circuit 102. This bias current forces the output transistor(s) of the driving circuit 102 into an operating region where the output voltage is relatively insensitive to variations in output current, thereby further reducing the small signal output impedance of circuit 102. For example, assuming that the output of the driving circuit 102 is set to a low state, $V_S$ (DC) 208 is set slightly higher than the output voltage of circuit 102 so that the output of circuit 102 sinks some DC bias current. Note that the output of the driving circuit 102 could alternatively be set high and $V_S$ (DC) set slightly lower than the driver output voltage to force the driving circuit to source some DC current. Again, the goal is to limit DC current and to further reduce the output impedance of the driving circuit 102.

For illustration, assume that driving circuit 102 is a typical TTL logic circuit and assume that component 104 is a 33 Ohm resistor. A typical voltage value for the output of circuit 102 for a low output state is 0.2 Volts. $V_S$ (DC) 208 may typically be set to 1.0 Volts, resulting in the output of circuit 102 sinking a DC bias current of about 25 mA.

$V_S$ (AC) 206 is set to a smaller amplitude than $V_S$ (DC) 208 so that the current through the passive component 104 is dominated by the DC current. For example, in the above example using a 33 Ohm termination resistor, where the DC voltage across the resistor is 1.0 V–0.2 V=0.8 V, a suitable value for $V_S$ (AC) 206 would be 0.2 VAC. The AC current through the resistor is approximately equal to $V_S$ (AC) 206 divided by the value of the resistor. Note that the input of circuit 106 is inherently high impedance so that essentially no current flows through the input of circuit 106. There is some error due to the finite output impedance of circuit 102 and wiring resistance in the fixture 200 and tester 202. However, the wiring resistance problems are also present in the prior art configuration of FIG. 1. Given the measured AC voltage $V_M$ (AC) 212 and the value of the feedback resistor $R_F$ 210, the measured value of the termination resistor is: $R_F * V_S(AC)/(V_S (AC) - V_M (AC))$. If component 104 is a reactive component (capacitor or inductor), the preceding equation provides the impedance of component 104 at the particular frequency of the AC measurement.

For resistors, the same result can be achieved by making two sets of DC measurements at two different DC operating points and taking the difference. That is, for resistors, $V_S$(AC) 206 may be eliminated and detector 214 and $V_M$ 212 may be DC measurements. Given two DC voltage stimuli $V_S(1)$ and $V_S(2)$ and two corresponding DC measurements $V_M(1)$ and $V_M(2)$, the measured value of the termination resistor is $R_F*\{V_S(1)-V_S(2)\}/\{|V_S(1)-V_S(2)|-|V_M(1)-V_M(2)|\}$.

In the configuration of FIG. 2, the bias voltage is offset slightly from the output voltage of the digital integrated circuit to control the current through the passive component being tested. Therefore, the bias voltage is dependent on the output state of the digital integrated circuit and therefore the output state of the digital integrated circuit must be known. If an AC current source is used for the stimulus, then the stimulus current is independent of the output state of the digital integrated circuit. Therefore, with an AC current source, the state of the digital integrated circuit does not need to be known, it merely needs to be stable and low impedance.

Figure 3:
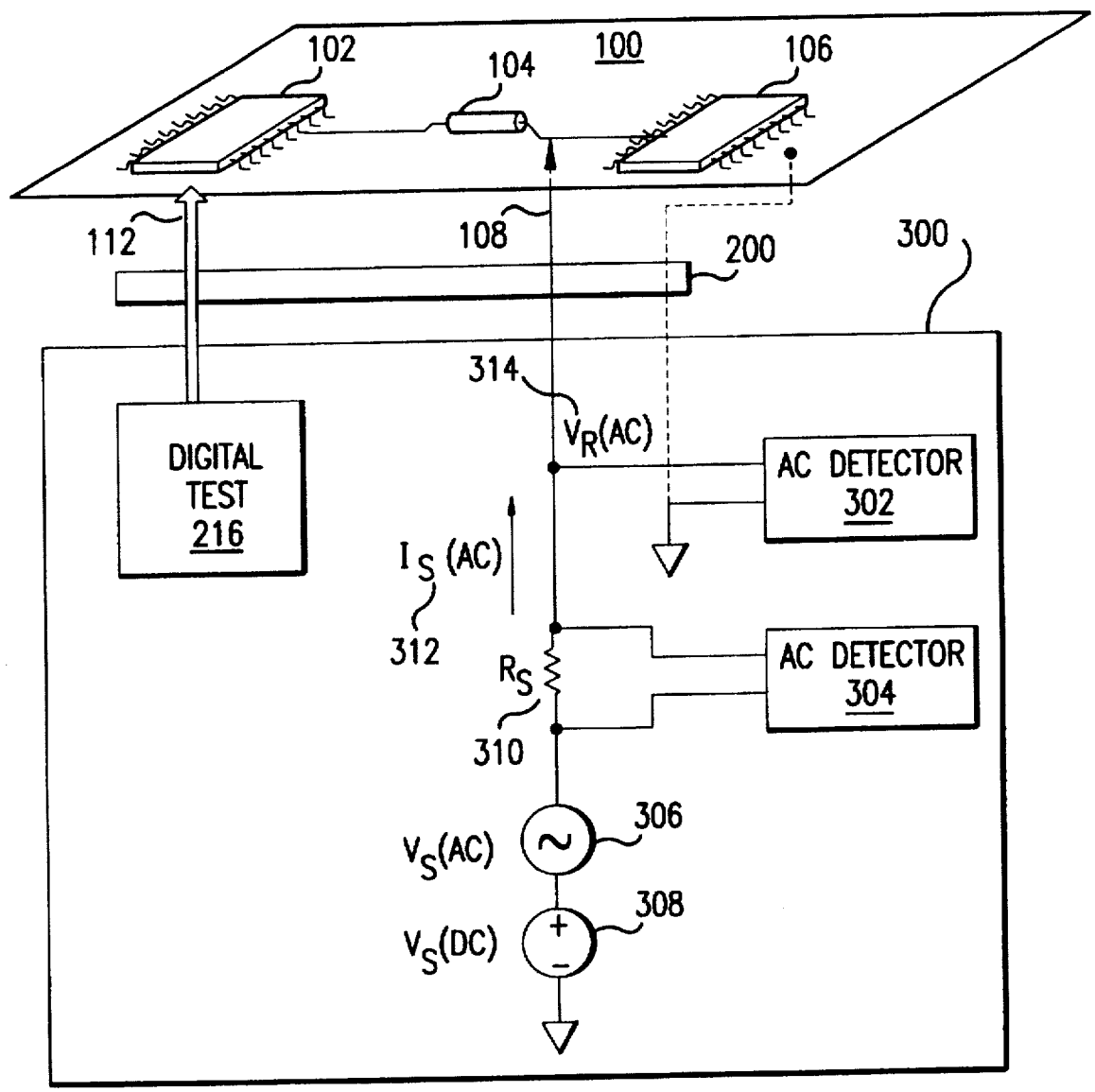
FIG. 3 is a block diagram schematic of a series passive component and an alternative embodiment of bed-of-nails test circuitry in accordance with the invention.

FIG. 3 illustrates an alternative embodiment of the invention using an AC current source for the stimulus. As in FIG. 2, power is applied to the circuit board 100. As in FIG. 2, digital test circuitry 216 may be used to set the output of circuit 102 to a low impedance state if necessary. It does not matter whether the state is high or low. In the embodiment of FIG. 3, a source voltage $V_S$ (306, 308) is applied through an additional resistor $R_S$ 310 placed inside the tester 300. Resistor $R_S$ has a resistance value that is much larger than the impedance of the component 104, thereby limiting any current through the output of driver circuit 102. The source voltage $V_S$ and resistor $R_S$ effectively form a current source and the voltage/resistor configuration is used for convenience. $V_S$ (DC) 308 is preferably set to the center of the output voltage range for the logic family of the driving circuit 102. $V_S$ (AC) 306 is set to a smaller amplitude than $V_S$ (DC) 308.

A first AC detector 304 measures the AC voltage across $R_S$ 310, from which the AC current $I_S$ (AC) 312 through the component 104 is computed. A second AC detector 302 measures the AC voltage $V_R$ (AC) 314 at nail 108 relative to ground. To further reduce the effects of trace resistance, the ground connection may be made through a separate fixture pin as depicted by a dashed line in FIG. 3. The impedance of component 104 is then approximately $V_R/I_S$. For a 33 Ohm termination resistor and a CMOS driving gate, a typical set of values is: $V_S$ (DC) 308 =2.5 VDC, $V_S$ (AC) 306=1.0 VAC, $R_S$ 310=500 Ohm, $I_S$ (AC) 312=1.9 mAAC, and $V_R$ (AC) 314 65 mVAC.

Again, for resistors, two DC measurements may be made instead of an AC measurement. The impedance of component 104 is then $\Delta V_R/\Delta I_S$.

Each of the embodiments described above reduce the cost and complexity of the fixture 200. In addition, eliminating one nail per termination component may also reduce circuit board complexity by eliminating special test pads or vias.

Note that circuit 102 is illustrated as a digital integrated circuit. However, the invention is equally applicable for any driver circuits having a low output impedance. In general, a low output impedance driver and an AC measurement enables a single node measurement. Note also that circuit 106 is not necessary to the invention. The only requirement for circuit 106 is high impedance. In particular, a system may be partitioned so that circuit 102 and component 104 are on one assembly and circuit 106 is on a separate assembly. For that configuration, circuit 106 is not present during testing and probe 108 may contact a connector.

Figure 4A:
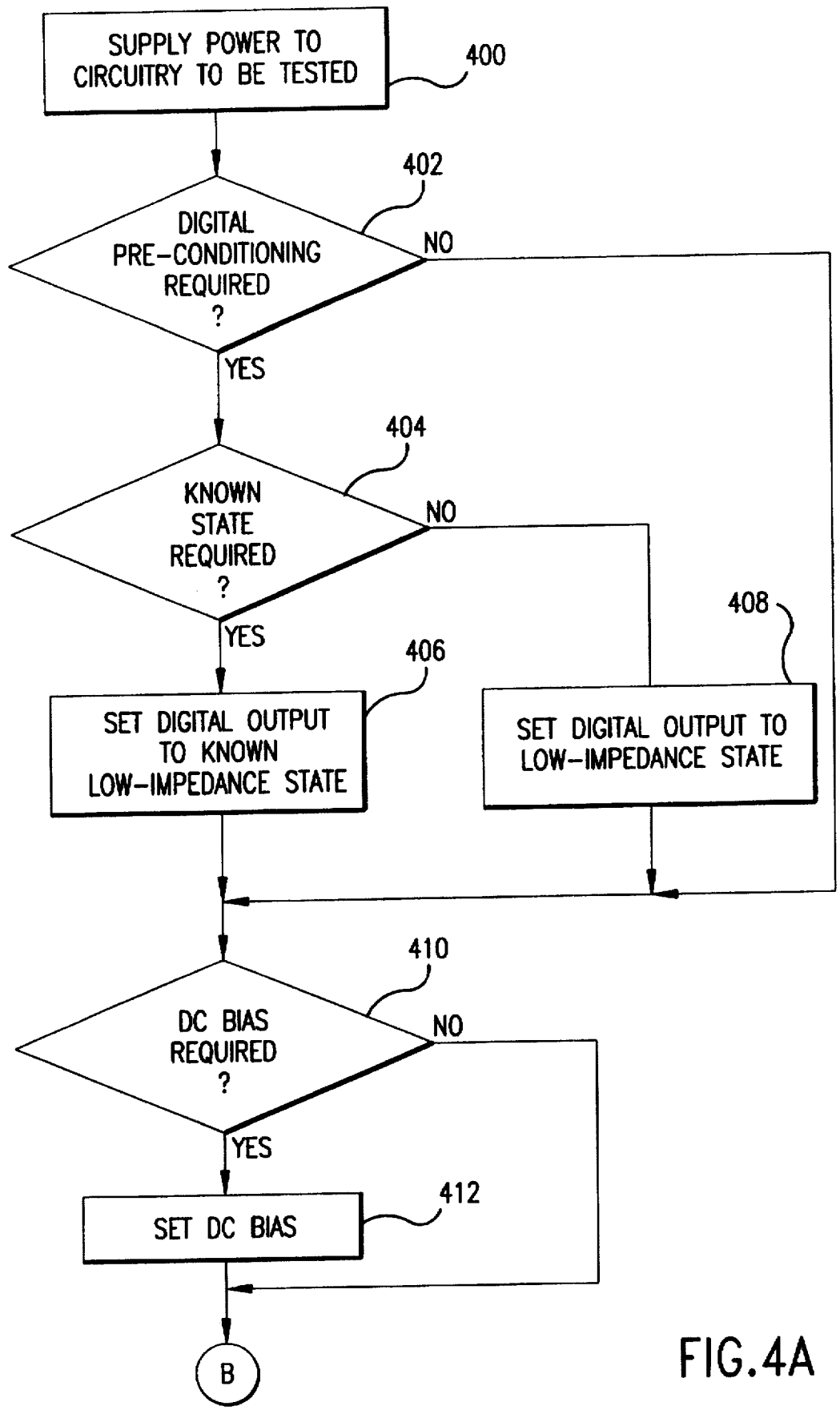
FIGS. 4A–4B are a flow chart of the method of the invention, illustrating alternative embodiments.
Figure 4B:
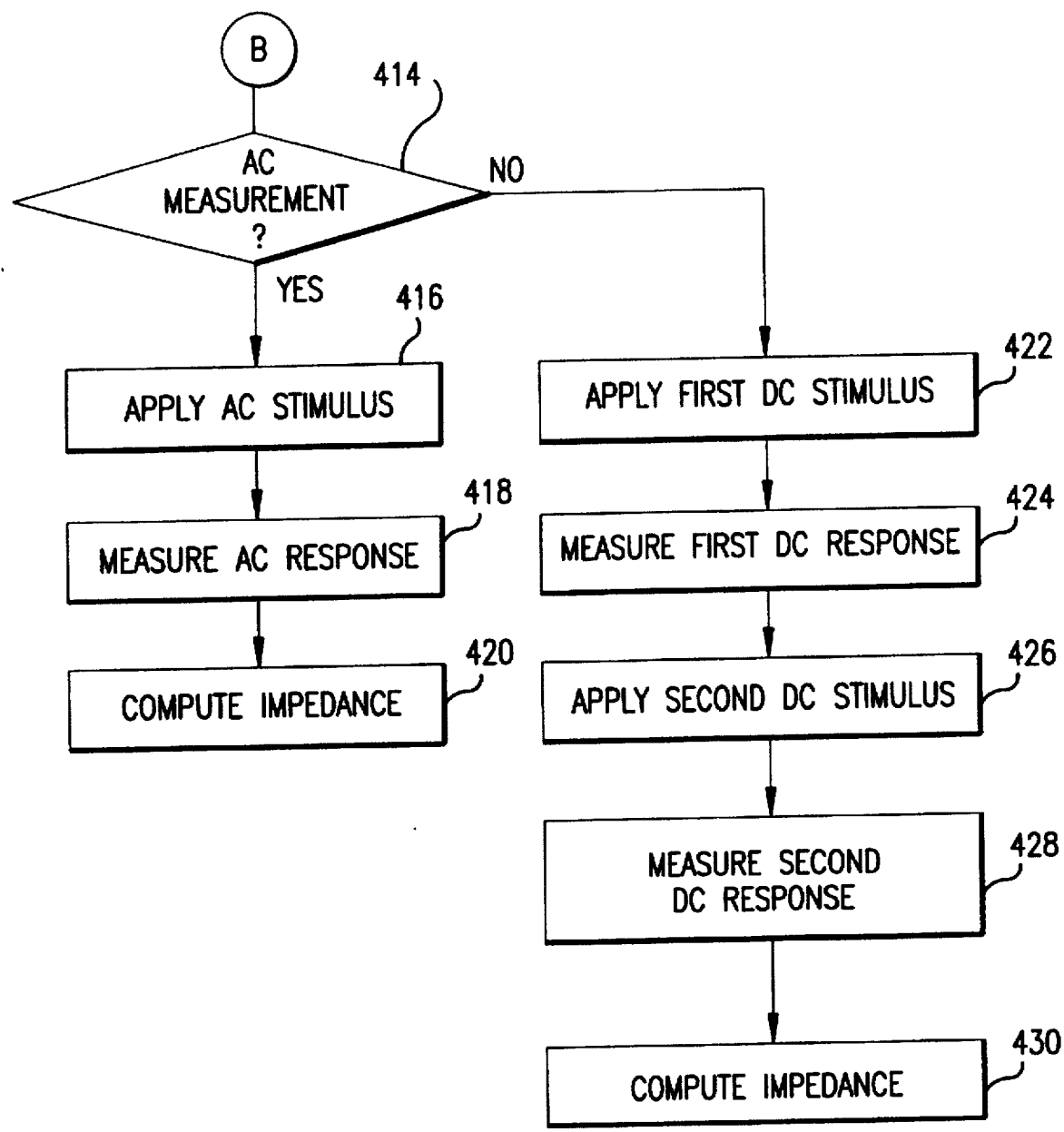

FIGS. 4A–4B illustrate the method of the invention. First power is provided to the digital circuits to enable an active low impedance output (step 400). Recall that some digital devices may inherently power on to a low impedance state. Therefore, digital preconditioning is optional (step 402). Recall, for example from FIG. 3, that it is not always necessary to know the digital output state. Therefore, setting the digital output to a known state is optional (step 404). Recall from FIG. 2, for AC measurements, the DC voltage source 208 in FIG. 2 is necessary only if DC current limiting is needed or if it is necessary or useful to lower the small signal impedance of the integrated circuit output. Therefore, the DC bias is optional (step 410). For resistance measurement, the AC voltage sources (206, 306) are not necessary. Therefore, AC measurement is optional (step 414).

The foregoing description of the present invention has been presented for purposes of illustration and description. It is not intended to be exhaustive or to limit the invention to the precise form disclosed, and other modifications and variations may be possible in light of the above teachings.

The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of testing a passive component, the passive component having first and second terminals, the first terminal of the passive component connected to an output of a circuit, the circuit having an output that is capable of being placed in multiple states and having an output impedance that is greater than zero, the method comprising the following steps:

(a) applying power to the circuit;

(b) placing the output impedance of the circuit in a low impedance state;

(c) driving the second terminal of the passive component with an AC electrical stimulus of a known value;

(d) measuring an AC electrical response at the second terminal of the passive component; and (e) computing the approximate impedance of the passive component using the known value of the AC electrical stimulus and the AC electrical response.

2. A method of testing a resistor, the resistor having first and second terminals, the first terminal connected to an output of a circuit, the circuit having an output that is capable of being placed in multiple states and having an impedance that is greater than zero, the method comprising the following steps:

(a) applying power to the circuit;

(b) placing the output impedance of the circuit in a low impedance state;

(c) driving the second terminal of the resistor with a DC electrical stimulus of a known first value;

(d) measuring a first DC electrical response at the second terminal of the resistor;

(e) driving the second terminal of the resistor with a DC electrical stimulus of a known second value;

(f) measuring a second DC electrical response at the second terminal of the resistor; and (g) computing the approximate impedance of the resistor using the known first and second values of the DC electric stimuli and the first and second measured DC electric responses.

3. The method of claim 1, step (b) further comprising:

placing the output impedance of the circuit in a known low impedance state.

4. The method of claim 3, step (c) further comprising:

driving the second terminal of the passive component with a DC stimulus sufficient to generate DC current flow through the output of the circuit.

5. The method of claim 1, the AC stimulus of step (c) being a voltage source.

6. The method of claim 1, the AC stimulus of step (c) being a current source.

7. The method of claim 2, step (b) further comprising:

placing the output impedance of the circuit in a known low impedance state.

* * * * *